United States Patent [19]

Enomoto et al.

[11] Patent Number: 4,774,620
[45] Date of Patent: Sep. 27, 1988

[54] LOGIC CIRCUIT

[75] Inventors: Hiromu Enomoto, Kawasaki; Yasushi Yasuda, Machida; Masao Kumagai, Tokyo; Akinori Tahara, Zushi, all of Japan

[73] Assignee: Fujitsu Limited, Kanagawa, Japan

[21] Appl. No.: 98,768

[22] Filed: Sep. 17, 1987

Related U.S. Application Data

[63] Continuation of Ser. No. 769,834, Aug. 27, 1985.

[30] Foreign Application Priority Data

Aug. 29, 1984 [JP] Japan ................................. 59-178257

[51] Int. Cl.$^4$ .............................................. H02H 3/20
[52] U.S. Cl. ........................................ 361/91; 361/56; 361/111
[58] Field of Search .................. 361/56, 91, 110, 111; 330/298, 207 P; 307/542

[56] References Cited

U.S. PATENT DOCUMENTS

| 4,036,199 | 7/1977 | Chateau | 361/91 X |
| 4,321,509 | 3/1982 | Miyaji et al. | 361/111 X |
| 4,349,854 | 9/1982 | Mori et al. | 361/91 X |
| 4,359,652 | 11/1982 | Jarrett et al. | 361/91 X |
| 4,513,341 | 4/1985 | Kollanyi | 361/91 |
| 4,573,099 | 2/1986 | Ganesan et al. | 361/56 |

OTHER PUBLICATIONS

K. Pollmann et al., IBM Technical Disclosure Bulletin, Dec. 1983, vol. 26, No. 7B, pp. 3675-3677.

Primary Examiner—J. R. Scott
Assistant Examiner—Derek S. Jennings
Attorney, Agent, or Firm—Armstrong, Nikaido, Marmelstein & Kubovcik

[57] ABSTRACT

A logic circuit which reduces occurrence of breakdown of the pull-down transistor and pull-up transistor in the output stage when a high voltage is applied to the power supply line and ensures high voltage resistance. The logic circuit controls a pull-up transistor provided between a first power supply and an output terminal which turns ON and OFF in accordance with a collector voltage of a phase splitter transistor and controls the pull-down transistor provided between the second power supply and output terminal with an emitter voltage. Breakdown of the pull-down and pull-up transistors can be reduced and a high voltage resistance ensured by providing a protection circuit which discharges the base of the pull-down transistor and turns OFF the pull-down transistor by detecting when a voltage difference between the first power supply and the second power supply exceeds a specified value.

3 Claims, 4 Drawing Sheets

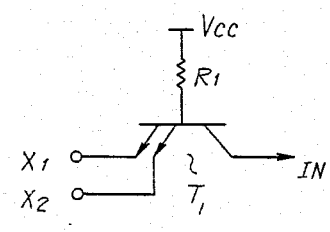 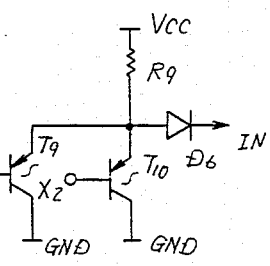
Fig. 6      Fig. 7      Fig. 8

LOGIC CIRCUIT

This application is a continuation of application Ser. No. 769,834 filed Aug. 27, 1985.

FIELD OF THE INVENTION

The present invention relates to a logic circuit and particularly to a logic circuit having a protection circuit which prevents breakdown of transistors in the output stage when a high voltage is applied to the power supply.

BACKGROUND OF THE INVENTION

Logic circuits such as Transistor Transistor Logic (TTL), Diode Transistor Logic (DTL), etc. are used in some cases near a device which generates a high voltage. For example, in case such logic circuits are used in the circuits connected to peripheral devices such as the CRT display device of a personal computer, a surge voltage of several hundreds to several tens of hundreds of volts is applied to the power supply line of a logic circuit in a moment when the power supply switch of the peripheral circuits is turned ON or OFF and thereby the transistors in the output stage of such logic circuits may be broken.

The process until occurrence of breakdown of transistors in the output stage of such logic circuit are explained with reference to a conventional 2-input NAND TTL circuit shown in FIG. 1. A multiemitter npn transistor $T_1$ of the input stage in FIG. 1 has a base connected to a power supply line $V_{cc}$ through a resistor $R_1$, a collector connected to the base of a phase splitter transistor $T_2$ and two emitters to which respective input signals $X_1$ and $X_2$ are applied. Such phase splitter transistor $T_2$ has a collector connected to the power supply line $V_{cc}$ through a resistor $R_5$ and an emitter connected to the base of a pull-down transistor $T_3$ of the output stage. The collector of phase splitter transistor $T_2$ is connected to the base of a transistor $T_5$, which has a collector connected to the power supply line $V_{cc}$ and an emitter connected to the base of a pull-up transistor $T_4$ in the output stage. The collector of the pull-up transistor $T_4$ is connected to the power supply line $V_{cc}$. The emitter of the pull-down transistor $T_3$ is connected to a ground line GND. Both the emitter of the pull-up transistor $T_4$ and the collector of the pull-down transistor $T_3$ are connected to an output terminal OUTPUT. Such pull-up transistor $T_4$ and transistor $T_5$ form an off-buffer circuit which operates with fast switching speed by improving the rising characteristic when the pull-down transistor $T_3$ is cut-off, namely the potential of output terminal OUTPUT changes to a high (H) level from a low (L) level with its output impedance kept lower. The base and emitter of the pull-up transistor $T_4$ are connected through a resistor $R_3$ to turn OFF the transistor $T_4$ by discharging the base thereof and to make faster the falling characteristic of the potential at the output terminal OUTPUT more rapid when transistor $T_4$ is cut-off. The base of pull-down transistor $T_3$ and the ground line GND are connected through a resistor $R_4$ to discharge the base of transistor $T_3$ and make the rising characteristic of the potential at the output terminal OUTPUT more rapid. A resistor $R_2$ is connected between the power supply line $V_{cc}$ and the base of phase splitter transistor $T_2$. This resistor $R_2$ supplied a base current to the transistor $T_2$ and this resistor $R_2$ is not always required. It should be noted that the transistors $T_2$, $T_3$ and $T_5$ are Schottky barrier diode clamp transistors for preventing their excessive saturation.

The TTL circuit of FIG. 1 provides a NAND function which makes the potential of the output terminal OUTPUT L level only when both input signals $X_1$ and $X_2$ become H level. When both input signals $X_1$ and $X_2$ are H level, a base-to-collector junction of the transistor $T_1$ is forward-biased, a current flows from the power supply line $V_{cc}$ through the resistor $R_1$ and the current becomes a base current of the phase splitter transistor $T_2$ with a current flowing through the resistor $R_2$. In this case, the phase splitter transistor $T_2$ in ON, a current is supplied to the collector of transistor $T_2$ through a resistor $R_5$, such current becomes a collector current and the emitter current of such transistor $T_2$ flows into the base of pull-down transistor $T_3$ and the resistor $R_4$. When the pull-down transistor $T_3$ is ON, since a potential of connecting point $N_1$ of the collector phase splitter transistor $T_2$ and the resistor $R_5$ is L level, both the transistor $T_5$ and the pull-up transistor $T_4$ are OFF so that the potential of output terminal OUTPUT becomes L level.

Here, when a high voltage is applied to the power supply line $V_{cc}$, a base current and a collector current of the transistor $T_2$ and also a base current and an emitter current of the transistor $T_3$ increase. Therefore the voltages between the collector and emitter of the transistor $T_2$ and between the base and emitter of the transistor $T_3$ increase due to internal resistance of the transistor $T_2$ and transistor $T_3$, so that a potential of the connecting point $N_1$ of the transistor $T_2$ and the resistor $R_5$ increases. Consequently, both transistors $T_5$ and $T_4$ are turned ON. Therefore, since both the pull-down transistor $T_3$ and pull-up transistor $T_4$ in the output stage are turned ON, an excessive current I flows to the ground line GND from the power supply line $V_{cc}$ through the transistors $T_3$, $T_4$ in the output stage and thereby these transistors $T_3$, $T_4$ are destroyed.

That is, the base-emitter junction of the transistors is broken by a penetration of aluminum which is formed as an emitter electrode.

Therefore, it is desirable that the pull-down transistor and the pull-up transistor in the output stage are protected from breakdown when a high voltage is applied to the power supply line.

SUMMARY OF THE INVENTION

It is an object of the present invention to provide a logic circuit which has a higher voltage resistance in order to protect the pull-down and pull-up transistors in the output stage from breakdown in case a high voltage is applied to the power supply line.

This object can be attained, according to the present invention, by providing a logic circuit comprising: a first power supply, a second power supply, an output terminal, a phase splitter transistor which turns ON and OFF in accordance with an input signal, a pull-down transistor which is turned ON and OFF by the emitter of the phase splitter transistor and is provided between the output terminal and the second power supply, a pull-up transistor which is tunred ON and OFF by the potential of the collector of the phase splitter transistor and is provided between the first power supply and the output terminal, and a protection circuit means for detecting when a potential difference between the first and second power supplies exceeds a predetermined level and discharging the base of the pull-down transistor so as to turn OFF the pull-down transistor.

Namely, in the present invention, the protection circuit detects the increase of voltage of the power supply line, forces the pull-down transistor to turn OFF and thereby prevents a breakdown of the pull-down transistor and pull-up transistor caused by a heavy current. Therefore, according to the present invention, even when a high voltage is applied to the power supply line, both the pull-down transistor and pull-up transistor are free from breakdown occurring due to a heavy current produced during a simultaneous ON state of the pull-up and pull-down transistors.

BRIEF DESCRIPTION OF THE DRAWINGS

FIG. 6, FIG. 7 and FIG. 8 show input stages which respectively can be adapted to the first, second, third, and fourth embodiments of the present invention.

Further features and advantages of the present invention will be apparent from the following description with reference to the accompanying drawings to which, however, the scope of the invention is in no way limited.

DETAILED DESCRIPTION OF THE INVENTION

Figure 1:
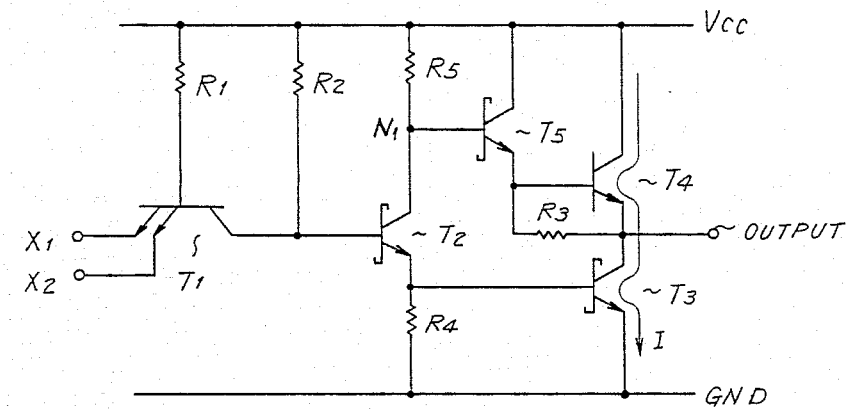
FIG. 1 is a circuit diagram illustrating a conventional logic circuit.
Figure 2:
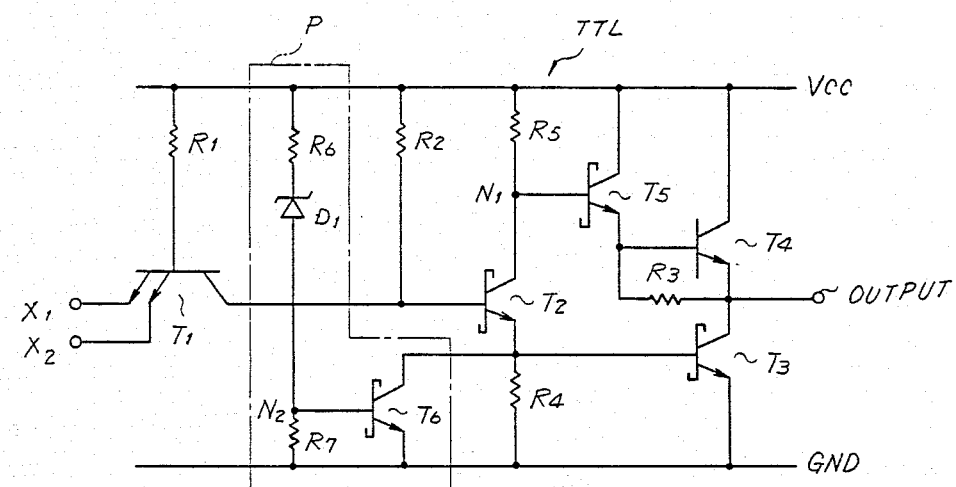
FIG. 2 shows a logic circuit of a first embodiment of the present invention.

FIG. 2 is a logic circuit in accordance with an embodiment of the present invention, illustrating an 2-input NAND circuit. In this embodiment, it is a feature of the present invention that a protection circuit P is added in FIG. 2 and the rest of the circuit configuration is the same as in the prior art.

The protection circuit P is basically composed of a zener diode $D_1$ and a transistor $T_6$. Namely, the protection circuit P comprises a zener diode $D_1$ having its cathode connected to the power supply line $V_{cc}$ through a resistor $R_6$ and its anode connected to the ground GND through a resistor $R_7$, and an npn transistor $T_6$ having its base connected between the anode of the zener diode and resistor $R_7$, its collector connected to the base of pull-down transistor $T_3$, and its emitter connected to the ground GND. The transistor $T_6$ is selected as a Schottky barrier diode clamp transistor in order to avoid its saturation.

If both input signals $X_1$, $X_2$ are H level in FIG. 2, the phase splitter transistor $T_2$ and the pull-down transistor $T_3$ are turned ON, the transistor $T_5$ and pull-up transistor $T_4$ are turned OFF, and a potential of the output terminal OUTPUT becomes L level. During this condition, a high voltage aplied to the power supply makes the output transistors break. That is, when a high voltage is applied to the power supply line $V_{cc}$, the current flowing into the phase splitter transistor $T_2$ and pull-down transistor $T_3$ through the resistor R increases and the voltage $V_{CE}(T_2)$ between the collector and emitter of the transistor $T_2$ and a voltage $V_{BE}(T_3)$ between the base and emitter of the transistor $T_3$ increase due to internal resistances of the transistors $T_2$ and $T_3$. Here, the collector resistance of the transistor $T_2$ is largest, as the internal resistance, and produces a large increase of voltage.

Therefore, a potential of the connecting point $N_1$ of the base of transistor $T_5$ and the collector of transistor $T_2$ increases, a potential difference between the output terminal OUTPUT and connecting point $N_1$ exceeds a sum $V_{BES}(T_5)+V_{BES}(T_4)$ of the turn ON voltage $V_{BES}(T_5)$ of transistor $T_5$ and the turn ON voltage $V_{BES}(T_4)$ of pull-up transistor $T_4$, and the transistor $T_5$ and pull-up transistor $T_4$ turn ON from the OFF state. When the pull-up transistor $T_4$ turns ON, both the pull-down transistor $T_3$ and the pull-up transistor $T_4$ are in an ON state and therefore a heavy current flows into the transistors $T_3$ and $T_4$ and thereby these transistors may be broken.

Such breakdown is particularly serious in case the output stage is formed by the pull-up and pull-down transistors, because when both transistors are turned ON, an excessive current flows due to a low impedance.

The breakdown is due to disconnection of the aluminum electrode resulting from melting of the electrode material of the transistor, or breakdown of the PN junction caused by diffusion of electrode material into a semiconductor substrate.

The protection circuit P in the embodiment of the present invention operates as follows.

When a high voltage applied to the power supply line $V_{cc}$ is a little lower than a voltage which turns ON the pull-up transistor $T_4$, or is higher than a voltage which turns ON the transistor $T_4$ but does not break the transistors $T_3$ and $T_4$, a voltage applied to the zener diode D exceeds the zener voltage so as to turn ON the zener diode. This means the diode $D_1$ detects a high voltage for operating the protection circuit P. Consequently a current flows into a resistor $R_7$ through the zener diode $D_1$. With such current, the potential of the connecting point $N_2$ of the anode of the zener diode $D_1$ and the resistor $R_7$ increases, the npn transistor $T_6$ having its base connected to such connecting point $N_2$ turns ON, the base charges of pull-down transistor $T_3$ are sent to the collector of transistor $T_6$ and thereby the pull-down transistor $T_3$ is forced to change to an OFF state from the ON state.

Here, since the base voltage of pull-down transistor $T_3$ is lowered to $V_{CE}(T_6)$ (the collector-emitter voltage of transistor $T_6$, 0.3 V) from $V_{BE}(T_3)$ (almost 0.9 V), the potential of connecting point $N_1$ is also lowered. Therefore the transistor $T_5$ and pull-up transistor $T_4$, if these are ON, turn OFF, or if these are OFF, maintain the same condition until the voltage of the power supply line becomes a very high voltage.

Namely, the protection circuit P in this embodiment detects the increase of voltage of the power supply line $V_{cc}$ by means of the zener diode $D_1$, turns ON the transistor $T_6$, turns OFF the transistor $T_3$ by discharging the base of pull-down transistor $T_3$, also lowers the potential of the connecting point $N_1$ and turns OFF the pull-up transistor $T_4$, and thereby protects the pull-down transistor $T_3$ and pull-up transistor from breakdown up to a very high voltage at the power supply line $V_{cc}$.

The resistor $R_6$ provided between the cathode of zener diode $D_1$ and power supply line $V_{cc}$ in the protection circuit P may be provided between the anode of zener diode $D_1$ and the base of transistor $T_6$ or it may be provided at both sides of zener diode $D_1$ by dividing its resistance. The resistor $R_6$ is provided for preventing current breakdown of zener diode $D_1$ when a high voltage is applied to the power supply line $V_{cc}$.

The multi-emitter npn transistor $T_1$ in the input stage shown in FIG. 2 may also be replaced by the circuits shown in FIG. 7 or FIG. 8. In the case where it is replaced with the input circuit of FIG. 7, a Diode Transistor Logic circuit can be configured.

Figure 3:
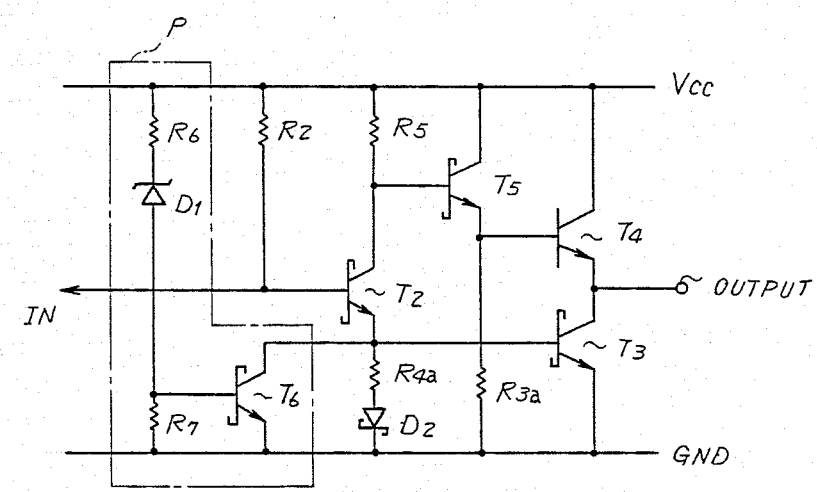
FIG. 3 shows a logic circuit of a second embodiment of the present invention.
Figure 4:
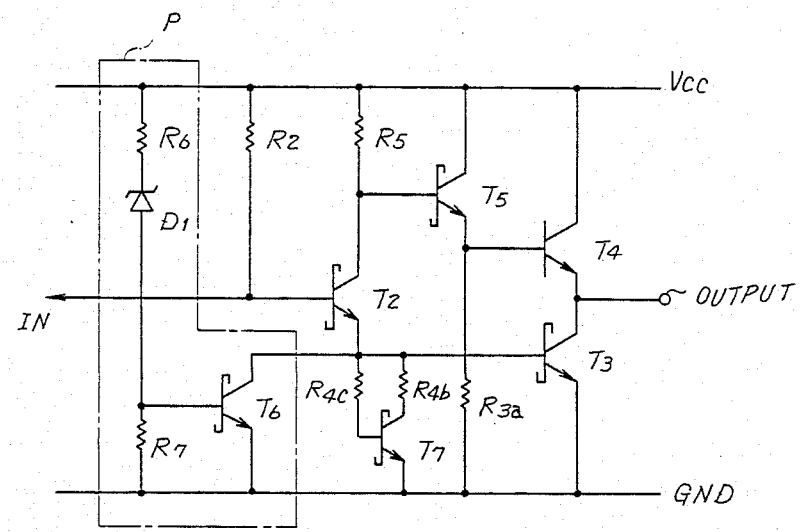
FIG. 4 shows a logic circuit of a third embodiment of the present invention.
Figure 5:
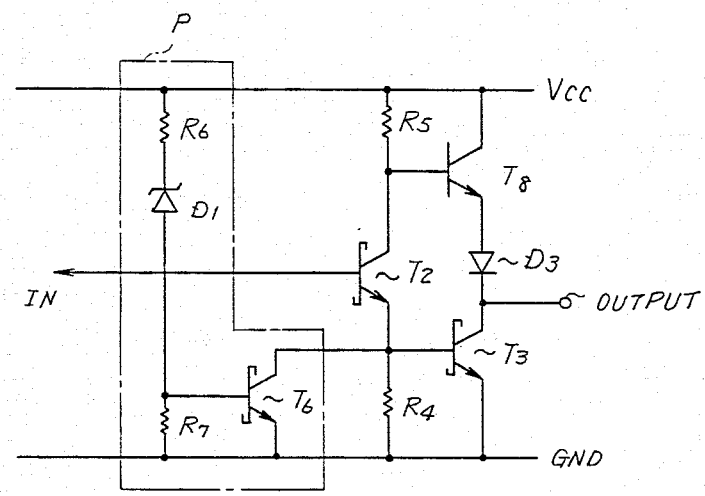
FIG. 5 shows a logic circuit of a fourth embodiment of the present invention.

FIG. 3 is a logic circuit of another embodiment of the present invention, FIG. 4 is a logic circuit of still another embodiment of the present invention and FIG. 5 is a logic circuit of a further embodiment of the present invention.

In the logic circuits of FIG. 3, FIG. 4 and FIG. 5, any input circuit of FIG. 6, FIG. 7 and FIG. 8 can be connected to the base of phase splitter transistor $T_2$, and the same protection circuit P as that in the logic circuit of FIG. 2 is also provided.

The logic circuit of the embodiment shown in FIG. 3 is different from that of FIG. 2 in that a base discharging resistor $R_{3a}$ is connected between the base of pull-up transistor $T_4$ and the ground GND in place of the base discharging resistor $R_3$ for the pull-up transistor $T_4$ in FIG. 2, and a resistor $R_{4a}$ and diode $D_2$ are connected in series between the base of pull-down transistor $T_3$ and the ground GND in place of the base discharging resistor $R_4$ for the pull-down transistor $T_3$. Since the base discharging resistor $R_{3a}$ is connected to the ground GND in this embodiment, the output terminal OUTPUT potential quickly falls to the L level from the H level by turning OFF the pull-up transistor $T_4$, from the ON state, and since a diode $D_2$ is provided in the base discharging circuit of the pull-down transistor $T_3$, in ordinary operation, the noise margin becomes large. The protection circuit P in the logic circuit of FIG. 3 protects the pull-down transistor $T_3$ and pull-up transistor $T_4$ from current breakdown as in the case of the logic circuit shown in FIG. 2.

The logic circuit of the embodiment shown in FIG. 4 is different from that shown in FIG. 3 in that the resistor $R_{4b}$ and resistor $R_{4c}$ and transistor $T_7$ are provided in place of the base discharging resistor $R_{4a}$ and diode $D_2$ shown in FIG. 3. The collector of transistor $T_7$ is connected to the base of pull-down transistor $T_3$ through the resistor $R_{4b}$, while the base of transistor $T_7$ is connected to the base of transistor $T_3$ through the resistor $R_{4c}$ and the emitter of transistor $T_7$ is connected to the ground GND. This embodiment operates as in the case of the logic circuit shown in FIG. 3.

The logic circuit of the embodiment shown in FIG. 5 is different from that shown in FIG. 2 in that the pull-up transistor $T_8$ and diode $D_3$ form the off-buffer circuit in place of the pull-up transistor $T_4$ and transistor $T_5$ shown in FIG. 2. The collector of pull-up transistor $T_8$ is connected to the power supply line $V_{cc}$, while the base of transistor $T_8$ is connected to the collector of phase splitter transistor $T_2$, and the emitter of transistor $T_8$ is connected to the anode of diode $D_3$. The cathode of diode $D_3$ is connected to the collector of pull-down transistor $T_3$. The protection circuit P in FIG. 5 protects the pull-down transistor $T_3$, pull-up transistor $T_8$ and diode $D_3$ from breakdown when a high voltage is applied to the power supply line $V_{cc}$ in the same manner as explained above.

FIG. 6, FIG. 7, and FIG. 8 show input circuits to be connected to the base of phase splitter transistor $T_2$ of the logic circuits shown in FIG. 3, FIG. 4, and FIG. 5.

FIG. 6 is an input circuit consisting of a multi-emitter npn transistor $T_1$ of which the base is connected to the power supply line $V_{cc}$ through the resistor $R_1$. This circuit outputs the signal IN of the AND logic function of the input signals $X_1$ and $X_2$ from the collector of transistor $T_1$ for supplying it to the base of thee phase splitter transistor $T_2$.

FIG. 7 shows an input circuit in which the anodes of Schottky diodes $D_4$ and $D_5$ are commonly connected and the connecting point of $D_4$, $D_5$ is connected to the power supply line $V_{cc}$ through the resistor $R_8$. The input signals $X_1$ and $X_2$ are applied to the cathodes of Schottky diodes $D_4$ and $D_5$, and thereby the signal IN of the AND logic function can be obtained at said connecting point. The input circuit shown in FIG. 7 operates faster than the input circuit of FIG. 6.

FIG. 8 is an input circuit consisting of the pnp transistors $T_9$ and $T_{10}$ having their emitters connected to each other, such connecting point being connected to the power supply line $V_{cc}$ through the resistor $R_9$, and both collectors are connected to the ground GND and a diode $D_6$ having its anode connected to the connecting point of the emitters of $T_9$ and $T_{10}$ with $R_9$. The input signals $X_1$ and $X_2$ are applied to the bases of pnp transistors $T_9$ and $T_{10}$ so that the signal IN of the AND logic function obtained at the cathode of diode $D_6$ is supplied to the base of phase splitter transistor $T_2$. In the input circuit of FIG. 8, when the pnp transistors $T_9$ and $T_{10}$ are ON, since a current flowing through the base is smaller than that flowing into the emitter, the input current through inputs $X_1$, $X_2$ can be set smaller than that of the input circuits of FIG. 6 and FIG. 7. Therefore, the number of input terminals to be connected can be increased.

In the above explanation, a 2-input NAND circuit is considered for explaining the logic circuit of the present invention, but the present invention is not limited only to such 2-input NAND circuit and other numbers of input circuits or other kinds of logic function circuits may be used.

We claim:

1. A logic circuit, comprising:
a first power supply
a second power supply
an output terminal,
a phase splitter transistor which turns ON and OFF in accordance with an input signal, the base of said phase splitter transistor receiving the input signal,
a pull-down transistor which is controlled ON and OFF by the emitter of said phase splitter transistor and is provided between said output terminal and said second power supply,
a pull-up transistor which is controlled ON and OFF by the potential of the collector of said phase splitter transistor and is provided between said first power supply and said output terminal, and
a protection circuit means for detecting when a voltage difference between said first power supply and second power supply reaches a predetermined level, wherein said protection circuit comprises a Zener diode which turns ON when said voltage difference exceeds said predetermined level, a resistor in which a current flowing into said Zener diode also flows, and a discharging transistor which operates with a voltage generated when a current flows into said resistor and is connected to the base of said pull-down transistor for discharging the base of said pull-down transistor so as to turn OFF said pull-down transistor and pull down a voltage of the collector of said phase splitter transistor in order to suppress an ON state of said pull-up transistor when said voltage difference reaches said predetermined level.

2. A logic circuit according to claim 1 wherein said discharging transistor comprises an npn transistor.

3. A logic circuit according to claim 1 wherein said discharging transistor comprises an npn transistor having a Schottky barrier diode clamp.

* * * * *